United States Patent
Feng

(10) Patent No.: US 11,152,398 B2
(45) Date of Patent: Oct. 19, 2021

(54) DISPLAY PANEL AND MANUFACTURING METHOD THEREOF

(71) Applicant: Wuhan China Star Optoelectronics Semiconductor Display Technology Co., Ltd., Hubei (CN)

(72) Inventor: Xiaoliang Feng, Hubei (CN)

(73) Assignee: WUHAN CHINA STAR OPTOELECTRONICS SEMICONDUCTOR DISPLAY TECHNOLOGY CO., LTD., Hubei (CN)

( * ) Notice: Subject to any disclaimer, the term of this patent is extended or adjusted under 35 U.S.C. 154(b) by 507 days.

(21) Appl. No.: 16/079,443

(22) PCT Filed: Jun. 22, 2018

(86) PCT No.: PCT/CN2018/092296
§ 371 (c)(1),
(2) Date: Aug. 23, 2018

(87) PCT Pub. No.: WO2019/205267
PCT Pub. Date: Oct. 31, 2019

(65) Prior Publication Data
US 2021/0098494 A1    Apr. 1, 2021

(30) Foreign Application Priority Data
Apr. 26, 2018 (CN) .......................... 201810388018.1

(51) Int. Cl.
*H01L 27/12* (2006.01)

(52) U.S. Cl.
CPC ........ *H01L 27/124* (2013.01); *H01L 27/1259* (2013.01)

(58) Field of Classification Search
CPC ............. H01L 27/124; G02F 1/136286; G02F 1/13454
See application file for complete search history.

(56) References Cited

U.S. PATENT DOCUMENTS

2008/0128689 A1   6/2008   Lee et al.
2010/0283050 A1   11/2010   Lee et al.

FOREIGN PATENT DOCUMENTS

| CN | 102403320 A | * | 4/2012 |
|---|---|---|---|
| CN | 105717690 A |   | 6/2016 |
| CN | 107565049 A |   | 1/2018 |
| CN | 107863359 A |   | 3/2018 |
| KR | 19980031762 A | * | 7/1998 |

* cited by examiner

*Primary Examiner* — Cuong Q Nguyen
*Assistant Examiner* — Peter M Albrecht
(74) *Attorney, Agent, or Firm* — Leong C. Lei

(57) ABSTRACT

A display panel includes a substrate, a thin film transistor (TFT) layer on the substrate, and multiple connection lines disposed between the substrate and the TFT layer. The TFT layer includes TFTs and signal lines connected to the TFTs for providing signals to the TFTs. Each connection line is electrically connected to a signal line. The present invention also teaches a display panel manufacturing method. The present invention has the connection lines formed in the display area, instead of in the non-display area, thereby reducing the width of the non-display area.

9 Claims, 8 Drawing Sheets

DISPLAY PANEL AND MANUFACTURING METHOD THEREOF

RELATED APPLICATIONS

The present application is a National Phase of International Application Number PCT/CN2018/092296, filed Jun. 22, 2018, and claims the priority of China Application No. 201810388018.1, filed Apr. 26, 2018.

FIELD OF THE INVENTION

The present invention is generally related to the field of display technology, and more particularly to a display panel and a related manufacturing method.

BACKGROUND OF THE INVENTION

Full-screen displays have become the mainstream product. To conform to this trend, manufacturers have adopted various designs to reduce the width of the so-called non-display area of the display panel. Techniques such as gate on array (GOA) have effectively fulfilled the demand for small-bezel displays.

FIG. 1 is a top-view diagram showing a layout of connection lines of a conventional display panel. As shown in FIG. 1, signal lines 201 such as data lines, Vint lines (for voltage transmission), and gate lines of the display area AA are connected to the bonding area through connection lines 101 of the non-display area NA. Therefore, the non-display area NA is required to have a certain width, resulting in a noticeable bezel of the display panel. Especially for a high-resolution display panel, there is a significant number of connection lines in the non-display area NA, making the non-display area NA even wider.

SUMMARY OF THE INVENTION

To resolve the above technical issue, an objective of the present invention is to provide a display panel and a manufacturing method capable of reducing the width of the non-display area.

The present invention teaches a display panel. The display panel includes a substrate, a thin film transistor (TFT) layer on the substrate, and multiple connection lines disposed between the substrate and the TFT layer. The TFT layer includes TFTs and signal lines connected to the TFTs for providing signals to the TFTs. Each connection line is connected to a signal line.

Furthermore, the display panel includes an insulation layer disposed between the substrate and the TFT layer, where vias are configured in the insulation layer, and each connection line is connected to a signal line through a via.

Furthermore, the display panel includes a display area and a bonding area, the vias includes first vias in the display area and second vias in the bonding area, and each connection line is connected to a signal line through a first via and to a bonding pad of the bonding area through a second via.

Furthermore, the first vias are located along a periphery of the display area.

Furthermore, the connection lines have projections onto the TFT layer not overlapped with ditch regions of the TFTs.

Furthermore, the signal lines includes data lines, gate lines, and voltage transmission lines.

The present invention also teaches a display panel manufacturing method including the steps of: forming multiple connection lines on a substrate; forming an insulation layer, with vias within, on the connection lines; forming a TFT layer on the insulation layer, where the TFT layer includes TFTs and signal lines connecting the TFTs and providing signals to the TFTs, and each connection line is electrically connected to a signal line through a via.

Furthermore, the display panel includes a display area and a bonding area. The step of forming multiple connection lines on a substrate includes forming multiple connection lines on the substrate in the display area and in the bonding area.

Furthermore, the step of forming an insulation layer, with vias within, on the connection lines includes forming the insulation layer, first vias in the display area and second vias in the bonding area, on the connection lines, where each connection line is connected to a signal line through a first via and to a bonding pad of the bonding area through a second via.

Furthermore, the connection lines have projections onto the TFT layer not overlapped with ditch regions of the TFTs.

The advantage of the present invention is that the display panel and its manufacturing method have the connection lines formed in the display area, instead of in the non-display area, thereby reducing the width of the non-display area and even achieving zero non-display area.

BRIEF DESCRIPTION OF THE DRAWINGS

In order to more clearly illustrate the embodiments of the present invention or prior art, the following figures will be described in the embodiments are briefly introduced. It is obvious that the drawings are merely some embodiments of the present invention, those of ordinary skill in this field can obtain other figures according to these figures without paying the premise.

DETAILED DESCRIPTION OF PREFERRED EMBODIMENTS

The following descriptions for the respective embodiments are specific embodiments capable of being implemented for illustrations of the present invention with referring to appended figures.

In the accompanied drawing, same numerals are applied to identical elements. It should be understandable that terms like "first," "second," etc. are for reference only. They do not imply preference or priority among the referred elements.

Figure 1:
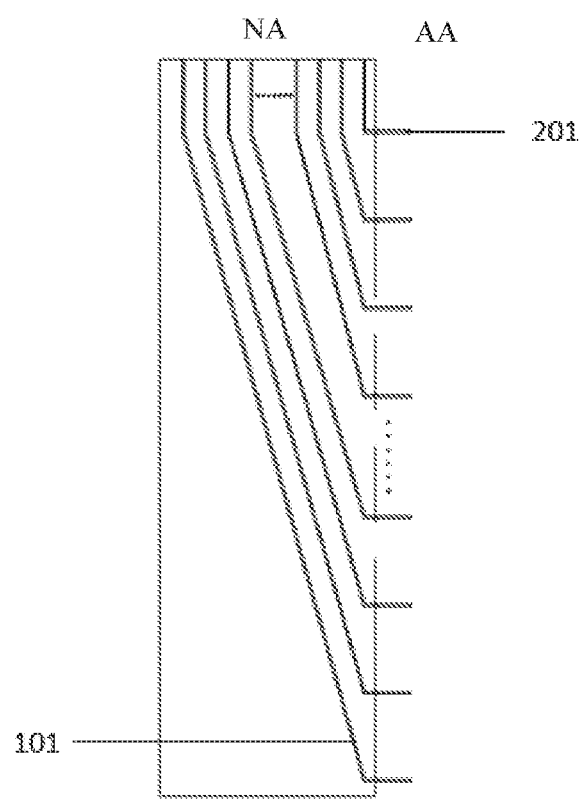
FIG. 1 is a top-view diagram showing a layout of connection lines of a conventional display panel.
Figure 2:
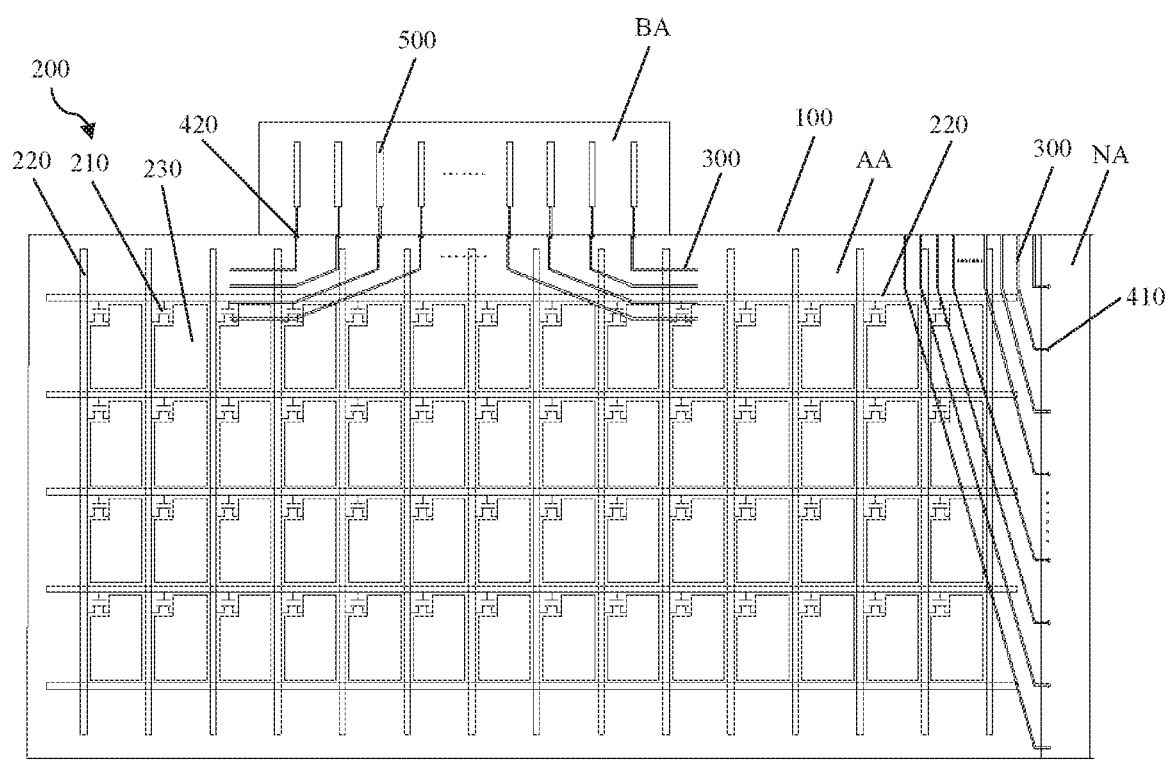
FIG. 2 is a top-view diagram showing a display panel according to an embodiment of the present invention.
Figure 3:
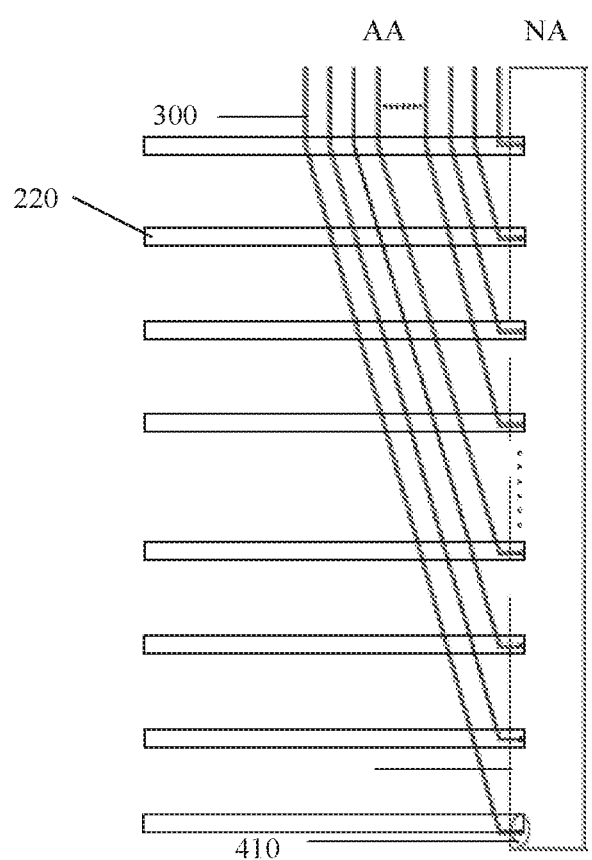
FIG. 3 is a top-view diagram showing the connection of connection lines and signal lines of the display panel of FIG. 2.
Figure 4:
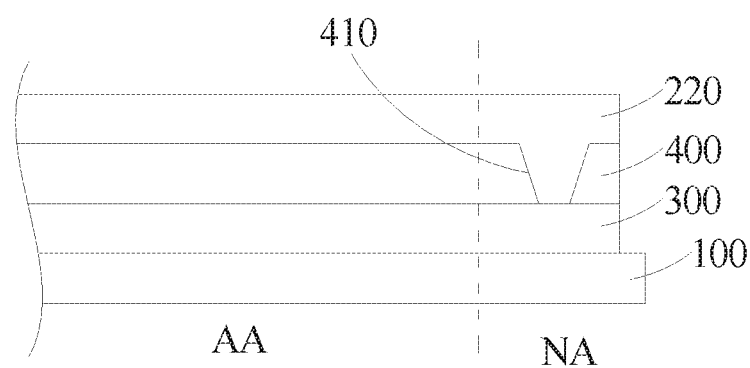
FIG. 4 is a sectional diagram showing the connection of connection lines and signal lines of the display panel of FIG. 2.
Figure 5:
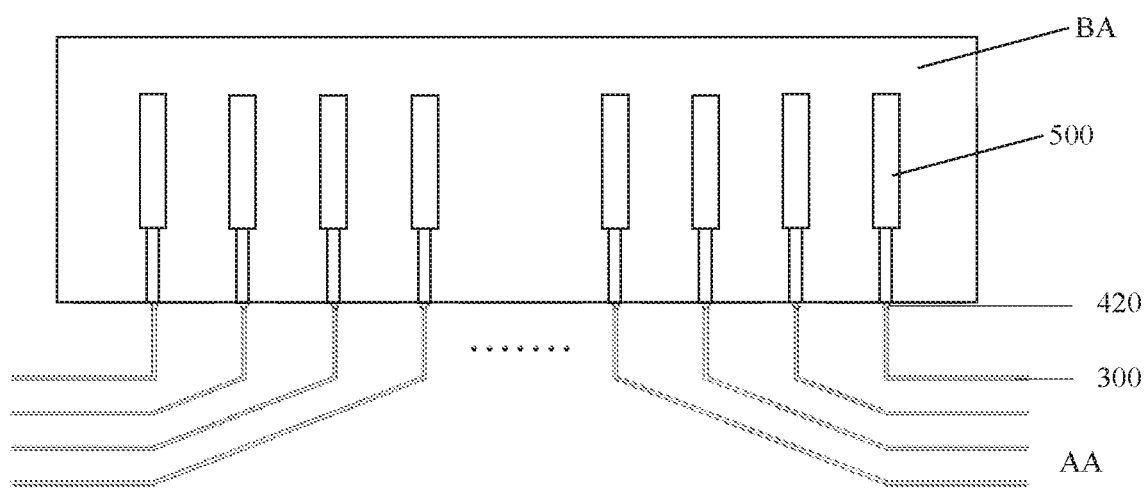
FIG. 5 is a top-view diagram showing the connection of connection lines and bonding pads of the display panel of FIG. 2.
Figure 6:
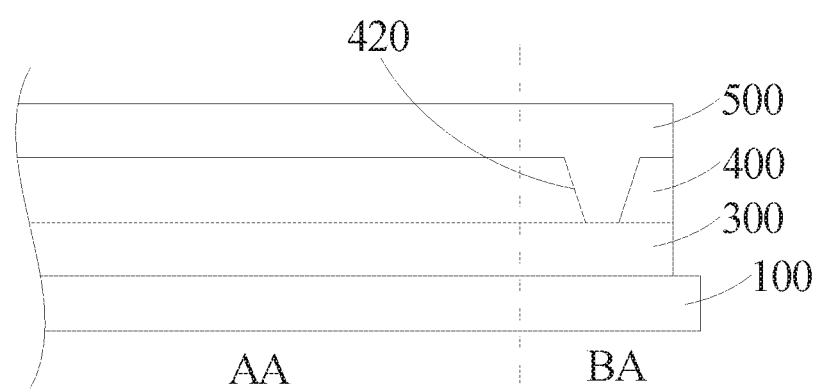
FIG. 6 is a sectional diagram showing the connection of connection lines and bonding pads of the display panel of FIG. 2.

FIG. 2 is a top view diagram showing a display panel according to an embodiment of the present invention. FIG. 3 is a top view diagram showing the connection of connection lines and signal lines of the display panel of FIG. 2. FIG. 4 is a sectional diagram showing the connection of connection lines and signal lines of the display panel of FIG. 2. FIG. 5 is a top-view diagram showing the connection of connection lines and bonding pads of the display panel of FIG. 2. FIG. 6 is a sectional diagram showing the connection of connection lines and bonding pads of the display panel of FIG. 2.

As shown in FIG. 2, a display panel according to an embodiment of the present invention includes a substrate 100, a TFT layer 200, and multiple connection lines 300.

The substrate 100 includes a display area AA. The TFT layer 200 is disposed within the active area AA. The TFT layer 200 includes TFTs 210, signal lines 220 connected to the TFTs 210, and display units 230 connected to the TFTs 210. Signal lines 220 are for providing display signals to the display units 230 through the TFTs 210.

In the present embodiment, signal lines 220 includes at least one type of data lines, gate lines, and Vint lines (for voltage transmission), but the present invention is not limited as such. Signal lines 220 may further include other lines of signal transmission required for display. The display units 230 include organic light emitting diode (OLED) or liquid crystal units, but the present invention is not limited as such.

Connection lines 300 are configured between the substrate 100 and the TFT layer 200. The connection lines 300 are connected to the signal lines 220 through first vias 410 within the display area AA. As such, the connection lines 300 are disposed within the display area AA, effectively reducing the width of non-display area NA. This way may even achieve the design of zero non-display area.

Furthermore, as shown in FIGS. 2 to 4, the present embodiment has the connection lines 300 and the signal lines 220 connected through the first vias 410 along the periphery of the display area AA. In other words, the first vias 410 are disposed along the periphery of the display area AA. It should be understandable that the points where the connection lines 300 and the signal lines 220 are connected do not affect the normal display function of the display area AA. The area where the connection lines 300 and the signal lines 220 are connected may be considered as a part of the non-display area NA. But this area is very narrow as it is only for fulfilling the connection of the connection lines 300 and signal lines 220, and the connection lines 300 are mostly outside this area.

Furthermore, if the points of connection between the connection lines 300 and signal lines 220 are located along the periphery and within the display area AA, then, there is no need to reserve an area for the connection of the connection lines 300 and the signal lines 220, thereby achieving the design of zero non-display area.

In addition, as shown in FIGS. 2, 5, and 6, the substrate 100 further includes a bonding area BA disposed to a side of the display area AA. Within the bonding area BA, multiple bonding pads 500 are disposed. The connection lines 300 have their first ends connecting the signal lines 220 at the first vias 410 within the display area AA, and their second ends extending into the bonding area BA through second vias 420 to connect the bonding pads 500. In the present embodiment, the bonding pads 500 are at a same layer as the TFT layer 200. The connection lines 300 extending into the bonding area AA are also disposed between the bonding pads 500 and the substrate 100.

Furthermore, the display panel further includes an insulation layer 400 within the display area AA, the non-display area NA, and the bonding area BA. The insulation layer 400 is disposed between the TFT layer 200 and the signal lines 300, and between the bonding pads 500 and the connection lines 300 so as to protect the connection lines 300, and to prevent accidental short circuit between the connection lines 300 and the signal lines 220, and between the connection lines 300 and the bonding pads 500. In addition, the first and second vias 410 and 420 are formed in the insulation layer 400.

Figure 7:
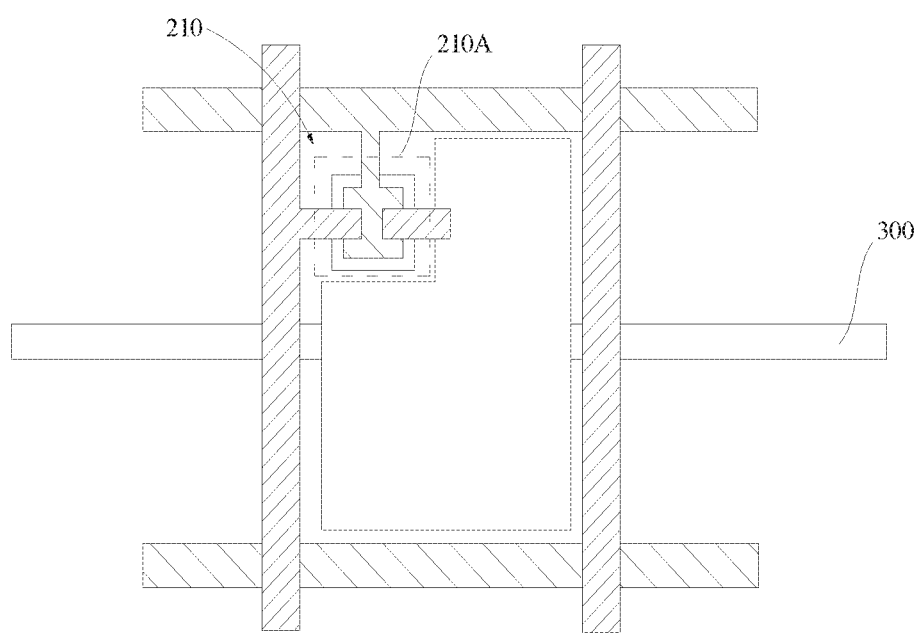
FIG. 7 is a top-view diagram showing arrangement of connection lines and TFTs of the display panel of FIG. 2.

FIG. 7 is a schematic diagram showing arrangement of connection lines and TFTs of the display panel of FIG. 2.

As shown in FIG. 7, to avoid that the connection lines 300 interfere signal-wise the ditch regions 210A of the TFTs 210, the present embodiment has the connection lines 300 formed outside the ditch regions 210A of the TFTs 210. In other words, the projection of the connection lines 300 onto the plane where the TFT layer 200 is located is outside the ditch regions 210A of the TFTs 210.

Figure 8:
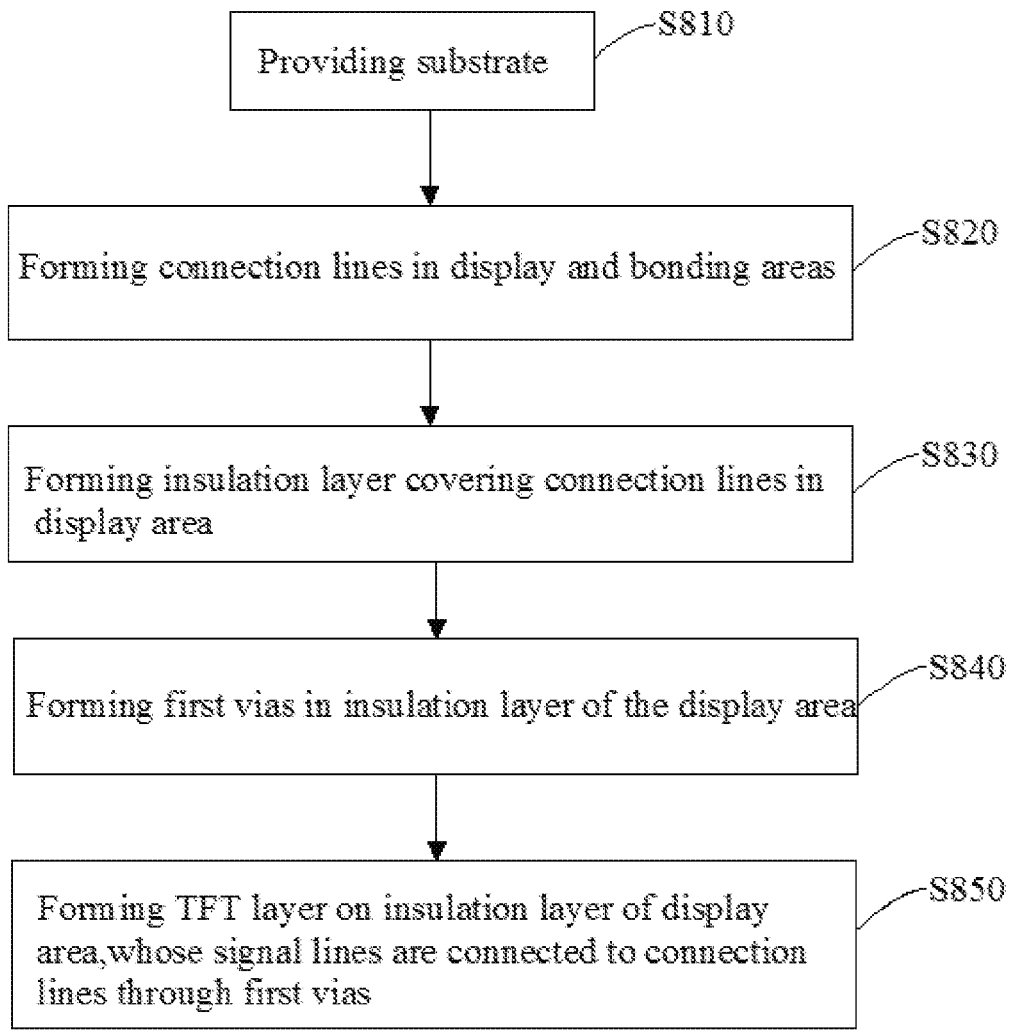
FIG. 8 is a flow diagram showing a display panel manufacturing method according to an embodiment of the present invention.

FIG. 8 is a flow diagram showing a display panel manufacturing method according to an embodiment of the present invention.

As shown in FIG. 8, the display panel manufacturing method includes the steps S810 to S850.

As shown in FIGS. 2 to 8, step S810 provides a substrate 100, where the substrate 100 has a display area AA and a bonding area BA.

Step S820 forms multiple connection lines 300 in the display area AA and the bonding area BA, where each connection line 300 extends from the display area AA to the bonding area BA.

Step S830 forms an insulation layer 400 covering the connection lines 300 in the display area AA. Furthermore, when forming the insulation layer 400 in the display area AA, step S830 also forms an insulation layer 400 covering the connection lines 300 in the bonding area BA.

Step S840 forms first vias 410 in the insulation layer 400 of the display area AA, each exposing a portion of a connection line 300 of the display area AA. Furthermore, when forming the first vias 410 in the display area AA, step S840 also forms second vias 420 in the insulation layer 400 of the bonding area BA, each exposing a portion of a connection line 300 of the bonding area BA.

As described above, the first vias 410 are located along the periphery of the display area AA, and do not affect the display of the display area AA.

Step S850 forms a TFT layer 200 on the insulation layer 400 of the display area AA, where the TFT layer includes TFTs 210, signal lines 220 connecting the TFTs 210, and display units 230 connecting the TFTs 210, the signal lines 220 provides display signals to the display units 230 through the TFTs 210, and the signal lines 220 are connected to the connection lines 300 through the first vias 410.

Furthermore, when forming the TFT layer 200 on the insulation layer 400 of the display area AA, step S850 also forms bonding pads 500 on the insulation layer 400 of the bonding area BA, where the bonding pads 500 are connected to the connection lines 300 extended into the bonding area BA through the second vias 420.

As described above, the display panel and its manufacturing method of the present invention have the connection lines formed in the display area, instead of in the non-display area, thereby reducing the width of the non-display area and even achieving zero non-display area.

Above are embodiments of the present invention, which does not limit the scope of the present invention. Any equivalent amendments within the spirit and principles of the embodiment described above should be covered by the protected scope of the invention.

What is claimed is:

1. A display panel, comprising:
    a substrate;
    a thin film transistor (TFT) layer comprising a plurality of TFTs and a plurality of signal lines connected to the TFTs for providing signals to the TFTs; and
    a plurality of connection lines disposed between the TFT layer and the substrate, where each connection line is electrically connected to a corresponding one of the signal lines,
    wherein the substrate comprises a display area in which the TFT layer is arranged and the plurality of TFTs of the TFT layer are arranged in a region of the display area, such that the region covers each of the plurality of TFTs, and wherein the plurality of connection lines are electrically connected to the plurality of signal lines of the TFT layer such that the electrical connection between each of the connection lines and the corresponding one of the signal lines is arranged at a location outside the region that covers each of the plurality of TFTs, such that all of the plurality of TFTs are located inside the region, and all of the electrical connections between the signal lines and the connection lines are located outside the region.

2. The display panel according to claim 1, further comprising an insulation layer disposed between the substrate and the TFT layer, where a plurality of vias are configured in the insulation layer, and each connection line is connected to the signal line through a via.

3. The display panel according to claim 2, wherein the display panel further comprises a bonding area; the vias comprises first vias in the display area and second vias in the bonding area; and each connection line is connected to the signal line through a first via and to a bonding pad of the bonding area through a second via.

4. The display panel according to claim 3, wherein the first vias are located in a periphery of the display area.

5. The display panel according to claim 1, wherein the connection lines have projections onto the TFT layer not overlapped with ditch regions of the TFTs.

6. The display panel according to claim 2, wherein the connection lines have projections onto the TFT layer not overlapped with ditch regions of the TFTs.

7. The display panel according to claim 3, wherein the connection lines have projections onto the TFT layer not overlapped with ditch regions of the TFTs.

8. The display panel according to claim 4, wherein the connection lines have projections onto the TFT layer not overlapped with ditch regions of the TFTs.

9. The display panel according to claim 1, wherein the signal lines comprise at least one type of data lines, gate lines, and voltage transmission lines.

* * * * *